(12) United States Patent
Saxena

(10) Patent No.: US 10,442,683 B2
(45) Date of Patent: Oct. 15, 2019

(54) CORRUGATED PACKAGE FOR MICROELECTROMECHANICAL SYSTEM (MEMS) DEVICE

(71) Applicants: Akustica, Inc., Pittsburgh, PA (US); Robert Bosch GmbH, Stuttgart (DE)

(72) Inventor: Kuldeep Saxena, Sewickley, PA (US)

(73) Assignees: Akustica, Inc., Pittsburgh, PA (US); Robert Bosch GmbH, Stuttgart (DE)

( * ) Notice: Subject to any disclaimer, the term of this patent is extended or adjusted under 35 U.S.C. 154(b) by 346 days.

(21) Appl. No.: 15/099,007

(22) Filed: Apr. 14, 2016

(65) Prior Publication Data

US 2017/0297905 A1 Oct. 19, 2017

(51) Int. Cl.
*B81B 7/00* (2006.01)
*B81B 7/02* (2006.01)
*B81C 1/00* (2006.01)

(52) U.S. Cl.
CPC .......... *B81B 7/0061* (2013.01); *B81B 7/0041* (2013.01); *B81B 7/02* (2013.01); *B81C 1/00333* (2013.01); *B81B 2201/0235* (2013.01); *B81B 2201/0242* (2013.01); *B81B 2201/0257* (2013.01); *B81B 2207/012* (2013.01); *B81C 2203/0109* (2013.01); *B81C 2203/0163* (2013.01)

(58) Field of Classification Search
CPC ............... B81B 7/0061; B81B 7/0041; B81B 2201/0257
USPC ............ 257/416, 415, 704; 438/51; 428/615
See application file for complete search history.

(56) References Cited

U.S. PATENT DOCUMENTS

| 4,769,345 | A * | 9/1988 | Butt ................... H01L 23/04 174/50.51 |
| 6,439,869 | B1 * | 8/2002 | Seng ................... B29C 45/02 264/272.17 |
| 7,923,790 | B1 * | 4/2011 | Quevy ................... B81B 7/02 257/414 |
| 2003/0138656 | A1 * | 7/2003 | Sparks ................... B32B 9/00 428/615 |

(Continued)

FOREIGN PATENT DOCUMENTS

DE 102014112672 A1 3/2016

OTHER PUBLICATIONS

International Search Report corresponding to International Patent Application PCT/EP2017/058633 (5 pages).

*Primary Examiner* — Dzung Tran
(74) *Attorney, Agent, or Firm* — Maginot Moore & Beck LLP

(57) ABSTRACT

A MEMS device package assembly for encapsulating one or more internal components includes a first MEMS device package. The first package includes a cover and a substrate attached to the cover by any suitable methods of attachment. A corrugated structure is formed on at least one of an inner or outer wall of the cover. The assembly further includes a second MEMS device package having a cover, a substrate, and a corrugated structured formed on at least one of an inner or outer wall of the cover. The first and second MEMS device packages may be coupled to the same substrate or different substrate. In another embodiment, the first MEMS device package may be mounted on the second MEMS device package. In yet another embodiment, the first MEMS device package may be contained in the second MEMS device package.

22 Claims, 11 Drawing Sheets

(56) References Cited

U.S. PATENT DOCUMENTS

| | | | |
|---|---|---|---|
| 2004/0231872 A1* | 11/2004 | Arnold | H01L 23/04 |
| | | | 174/377 |
| 2008/0247585 A1* | 10/2008 | Leidl | B81B 7/0061 |
| | | | 381/360 |
| 2009/0127697 A1* | 5/2009 | Pahl | B81B 7/0054 |
| | | | 257/698 |
| 2009/0194309 A1 | 8/2009 | Gillot et al. | |
| 2012/0032283 A1 | 2/2012 | Frey et al. | |
| 2013/0299928 A1 | 11/2013 | Classen et al. | |
| 2014/0077317 A1* | 3/2014 | Hsieh | B81B 3/00 |
| | | | 257/416 |
| 2014/0227816 A1 | 8/2014 | Zhang et al. | |
| 2015/0028433 A1 | 1/2015 | Baillin et al. | |

\* cited by examiner

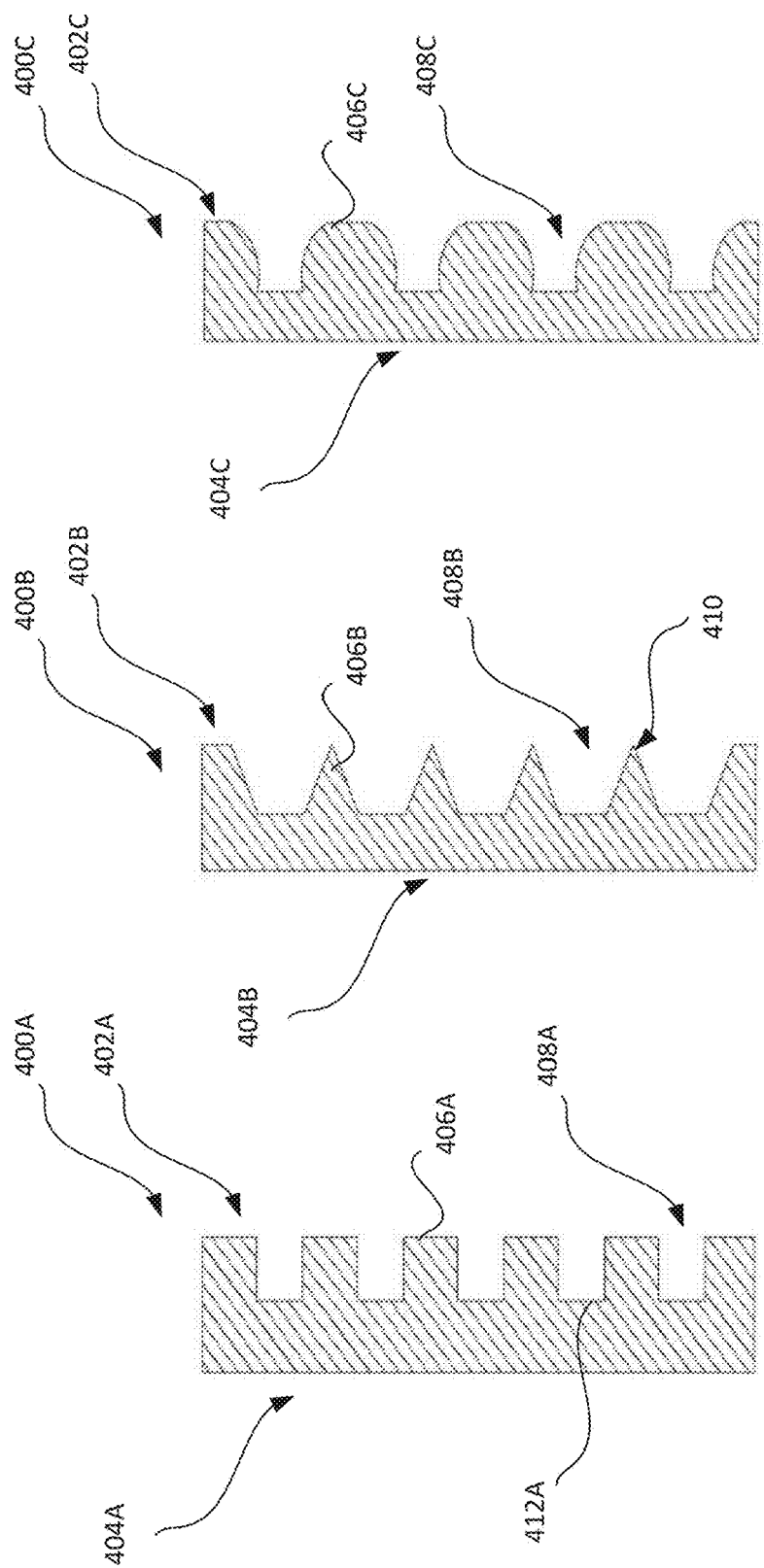

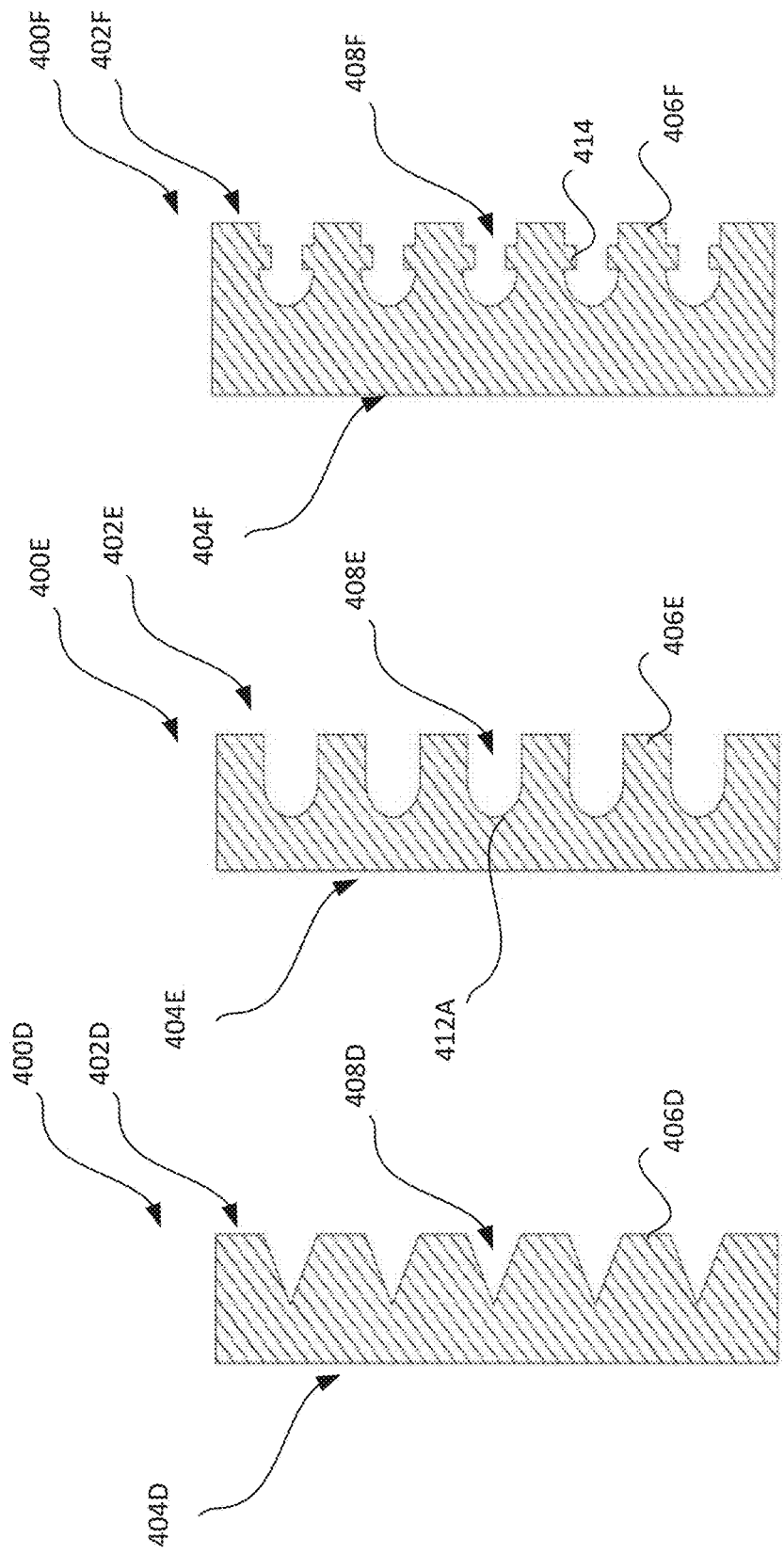

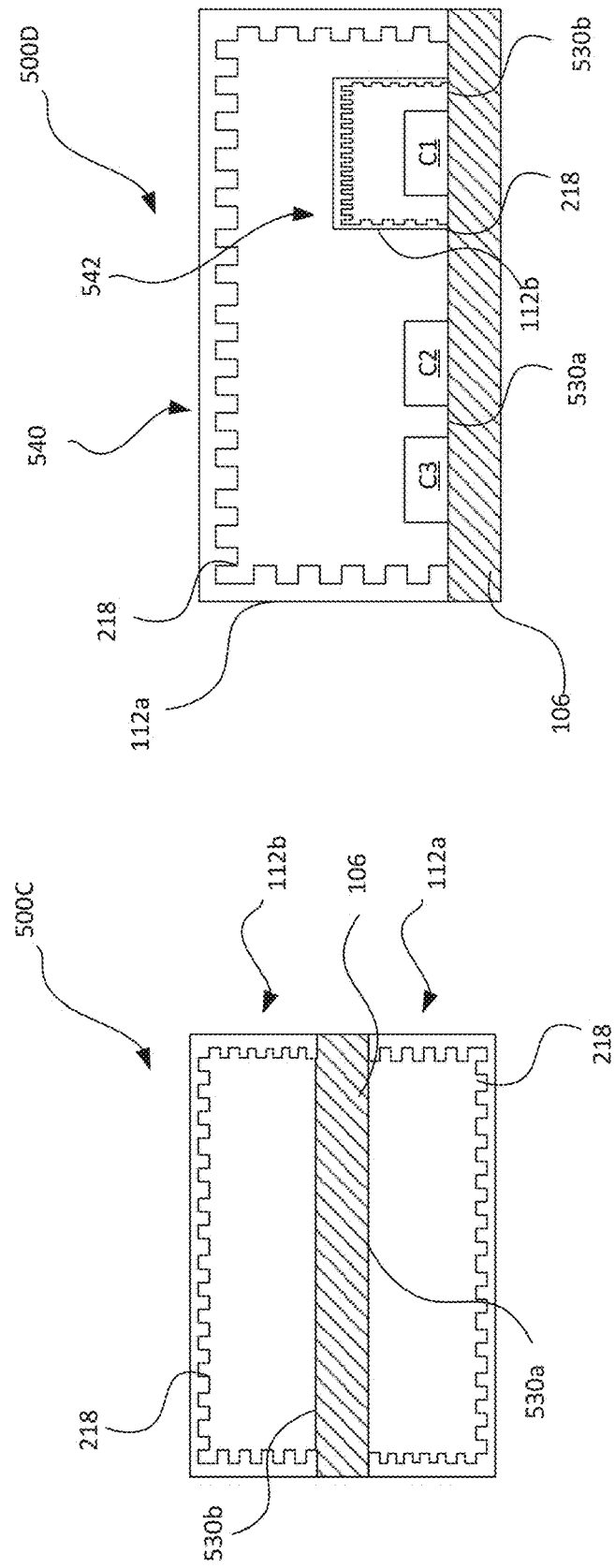

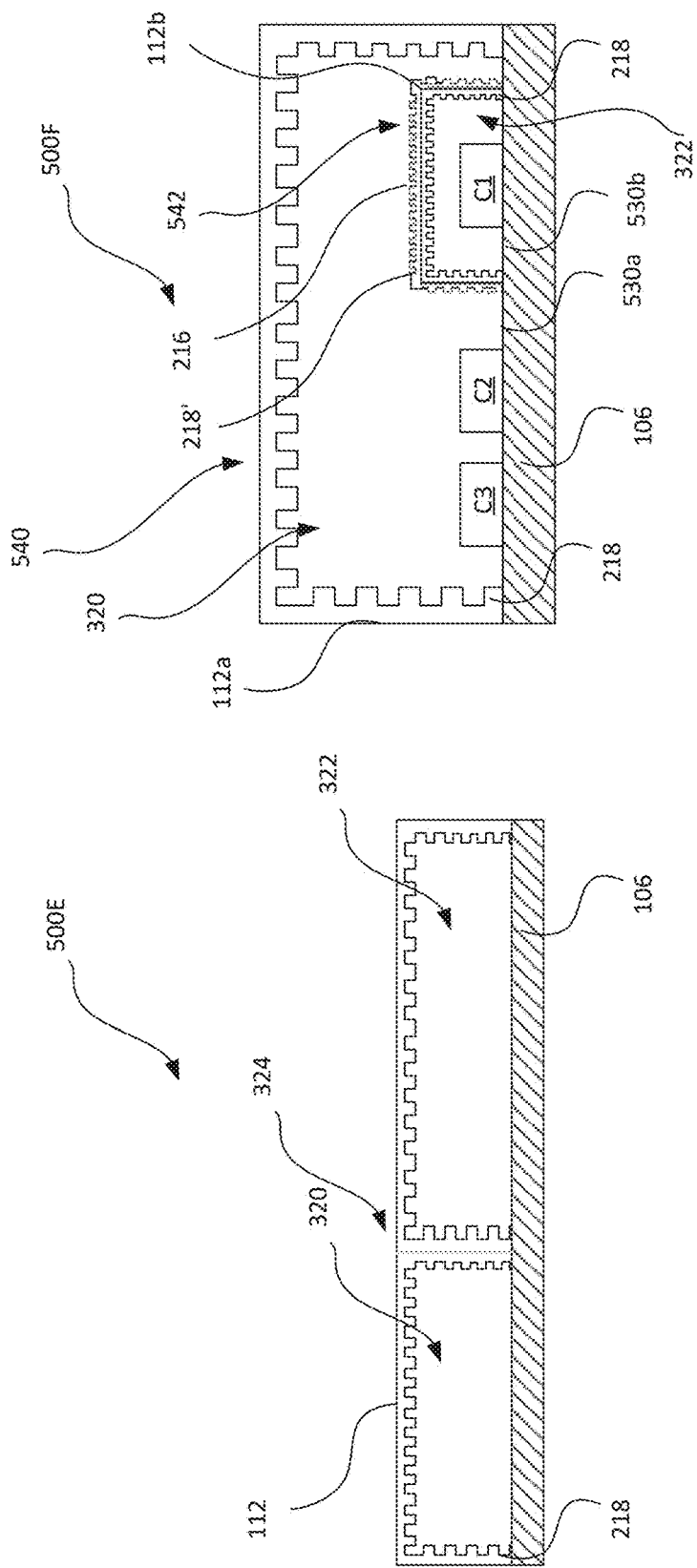

CORRUGATED PACKAGE FOR MICROELECTROMECHANICAL SYSTEM (MEMS) DEVICE

FIELD

This disclosure relates generally to MEMS device, particularly, to a Microelectromechanical System (MEMS) device with a corrugated package.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Embodiments of the disclosure related to a MEMS device package. The package includes a substrate having a first and second surface, a cover having an inner region and an outer region. The cover coupled to the substrate defines a cavity, and at least one device is disposed within the cavity. The MEMS device package further includes a corrugated structure formed on at least one of the inner region or the outer region. In other aspect, the MEMS device package includes a common region formed within the cavity. The common region divides the cavity into first and second volumes. Any number of internal components may be disposed within the first and second volumes.

In another embodiment, a combo MEMS device package assembly comprises a substrate, a first cover having an inner wall, a second cover having an inner wall, and a corrugated structure formed on at least one of the inner wall of the first or second cover, wherein the first cover and second cover are coupled to the substrate.

BRIEF DESCRIPTION OF THE DRAWINGS

These and other features, aspects, and advantages of this disclosure will become better understood when the following detailed description of certain exemplary embodiments is read with reference to the accompanying drawings in which like characters represent like arts throughout the drawings, wherein:

FIGS. 4A-4F are cross-sectional views illustrating various described embodiments of corrugated structure of the MEMS device package of FIG. 2;

FIGS. 5A-5F are cross-sectional views illustrating various described embodiments of a combo MEMS device package.

DETAILED DESCRIPTION

The following description is presented to enable any person skilled in the art to make and use the described embodiments, and is provided in the context of a particular application and its requirements. Various modifications to the described embodiments will be readily apparent to those skilled in the art, and the general principles defined herein may be applied to other embodiments and applications without departing from the spirit and scope of the described embodiments. Thus, the described embodiments are not limited to the embodiments shown, but are to be accorded the widest scope consistent with the principles and features disclosed herein.

Figure 1:
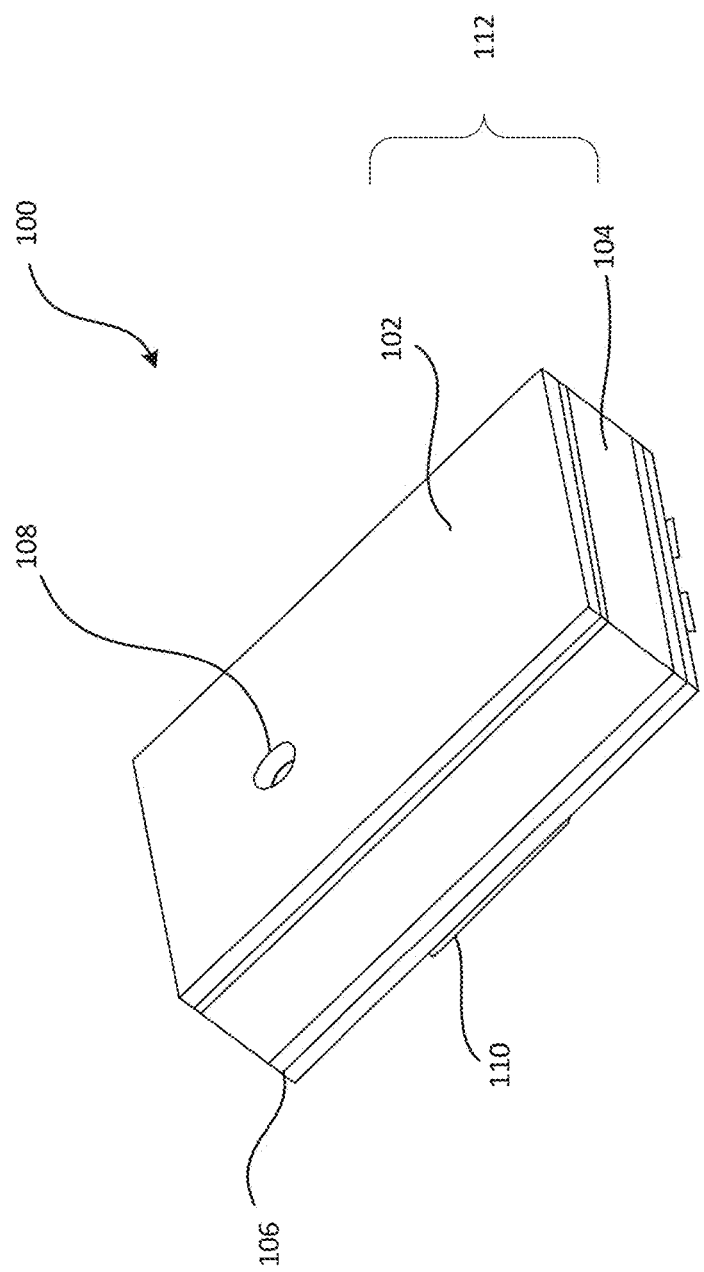
FIG. 1 is a perspective view of an exemplary MEMS device package according to the disclosure.

FIG. 1 is a perspective of a MEMS device package 100 according to an exemplary embodiment of the disclosure. The package 100 for encapsulating one or more internal components includes a lid 102, a spacer 104, and a substrate 106 attached to the spacer 104 by any suitable method of attachment. The internal component may be a MEMS transducer, a semiconductor device, a speaker, a receiver, a microphone, a pressure sensor, a thermal sensor, an optical sensor, an imaging sensor, a chemical sensor, a gyroscope, an accelerometer, a gas sensor, an environmental sensor, a motion sensor, a navigation sensor, an integrated circuit, an ASIC, a processor, a controller, an energy storage device, and any suitable components. Depending on the application, an optional port 108 may be formed on the package 100 by etching, drilling, punching, or any suitable method of forming the port for receiving attributes from an environment to which the package 100 is exposed. The attributes may be acoustic signal, pressure signal, optical signal, gas signal, and any suitable signal. As illustrated, the MEMS device 100 is a microphone. Although the MEMS device package 100 as depicted comprises a three piece structure, various configurations either in a single structure, a two piece structure, or more than three piece structure may be used to encapsulate one or more internal components. As an example, the lid 102 and the spacer 104 may be formed as a single structure, defined as a cover or a cap 112. One or more bonding pads 110 for mounting the package 100 to either an external printed circuit board of a client device or another support member may be formed on substrate 106 opposed to the cover 112 by any suitable method.

Figure 2:
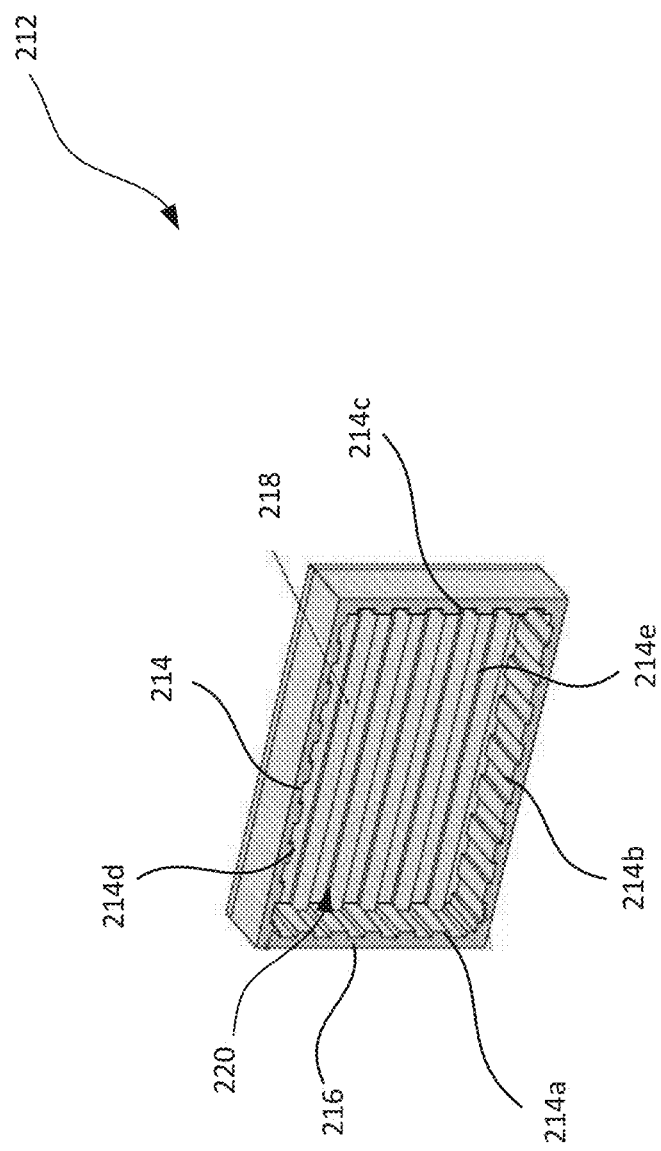
FIG. 2 is a perspective view of a cover of the MEMS device package of FIG. 1 according to a described embodiment of the disclosure.

FIG. 2 illustrates a perspective view of a cover 212 of the package 100 according to an exemplary embodiment of the disclosure. The cover 212 is identical to the cover 112 depicted in FIG. 1, except that a port for the cover 212 is either omitted or not required, depending on the type of internal component to be encapsulated to form a MEMS device package 100. The cover 212 includes an inner region 214 and an outer region 216, and may be formed from a molded process or any suitable techniques. At least a portion of the inner region 214 is covered by a corrugated structure 218. As can be seen, the inner region 214 comprises several walls, four side walls 214a-214d and an upper wall 214e are illustrated, and these walls 214a-214e may include a corrugated structure 218. In some embodiments, the corrugated structure 218 may be formed on the upper wall 214e. In another embodiment, one or more walls 214a-214d may be formed with the corrugated structure 218. In yet another embodiment, the corrugated structure 218 may partially covered at least one of a portion of any walls 214a-214e. The corrugated structure 218 forms a surface of at least one of the walls 214a-214e. Since the surfaces of the walls 214a-214e are corrugated, the overall thickness of the cover 212 may be reduced by approximately either 5%, 10%, 20%, 30%, 40%, or any percentage without scarifying the rigidness and durability of the housing and yet protecting the one or more internal components disposed within the package 100. In other words, the inner region 214 formed with the corrugated structure 218 not only increases the strength of the cover 212, an overall volume of a cavity 220 formed within the cover 212 after attached to the substrate 106 of the package 100 also increases. The shape and configuration of the corrugated structure 218 may vary, depending on the application. Although, identical corrugated structure 218 is formed on the walls 214a-214d, different shapes and configurations of the corrugated structure 218 may be formed on the same package 200. Various configurations and methods of forming the corrugated structure will be described in greater detail below.

Figure 3:
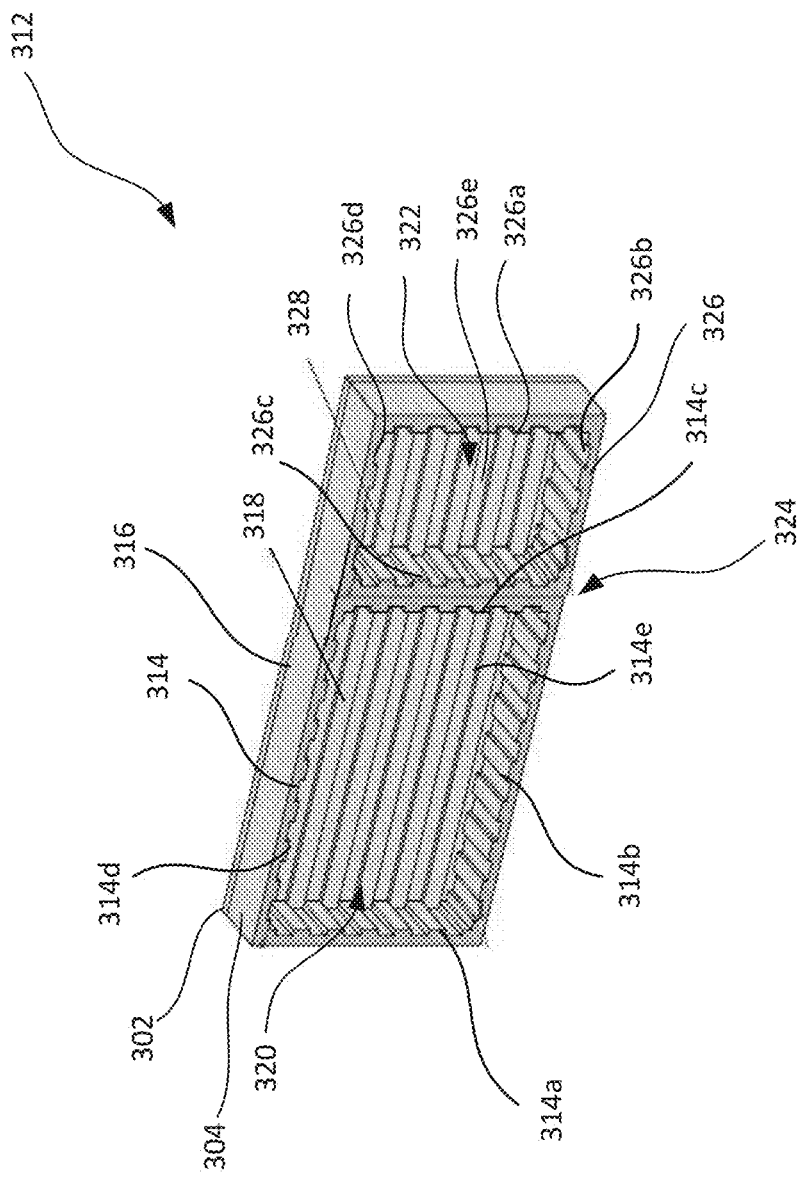
FIG. 3 is a perspective view of a cover of the MEMS device package of FIG. 1 according to another described embodiment of the disclosure.

FIG. 3 illustrates a perspective view a cover 312 of the package 100 according to an exemplary embodiment of the disclosure. The cover 312 is identical to the cover 212 depicted in FIG. 2, except that the cover 312 includes two volumes 320, 322 isolated from each other by a common region 324. Depending on the application, more than two volumes may be formed within the cover 312. In some embodiments, the volumes 320, 322 may have the same dimension. In another embodiment, volume 320 may have a dimension either greater or less than the dimension of the volume 322. A port may be optionally formed on the cover 312 to provide a passageway to receive attributes from the environment to one or more of the volumes 320, 322. Like the cover 212 depicted in FIG. 2, the cover 312 may be formed from a molded process or any suitable techniques from a single structure. In some embodiments, two covers are formed separately and these covers are coupled together by any attachment techniques such as adhesive, solder, or etc. If two or more covers are formed, the covers may be coupled together in either a side-by-side configuration, back-to-back configuration, front-to-back configuration, back-to-front configuration, or combination thereof, to encapsulate any internal components. In another embodiment, the package may include a first cover and a second cover having a dimension greater than the first cover to encapsulate the first cover. The cover 312 includes first inner region 314 and second inner region 326, and a common outer region 316. The first volume 320 may be located in the first inner region 314 and the second volume 322 may be located in the second inner region 326. The inner regions 314, 326 include walls 314a-314d, 326a-326d, respectively. One or more walls 314a-314d, 326a-326d form a portion of the common region 324. As depicted, the walls 314c, 326c are formed as part of the common region 324. The inner regions 314, 326 further include upper walls 314e, 326e, respectively.

As illustrated in FIG. 3, the walls 314a-314e, 326a-326e include corrugated structures 318, 328. In some embodiments, the corrugated structures 318, 328 may be formed on any walls 314a-314e, 326a-326e. In another embodiment, the corrugated structures 318, 328 may partially covered at least any portion of the walls 314a-314e, 326a-326e. The corrugated structures 318, 328 may form as a surface of any walls 314a-314e, 326a-326e. Since the surfaces of the walls 314a-314e, 326a-326e are corrugated as depicted in FIG. 3, the overall thickness of the cover 312 may be reduced by approximately either 5%, 10%, 20%, 30%, 40%, or any percentage without scarifying the rigidness and durability of the housing and yet protecting the one or more internal components disposed within the package. In other words, the inner regions 314, 326 formed with the corrugated structures 318, 328 not only increase the strength of the cover 312, and the volumes 320, 322 formed within the cover 312 also increase. The shape and configuration of the corrugated structures 318, 328 may vary, depending on the application. Although, identical corrugated structures 318, 328 are formed on the walls 314a-314e, 326a-326e, different shapes and configurations of the corrugated structures 318, 328 may be formed on the same package. Various configurations and methods of forming the corrugated structure will be described in greater detail below.

FIGS. 4A-4F illustrate various described embodiments of a corrugated structure 400A-400F for the MEMS device package. Each corrugated structure 400A-400F comprises a top portion 402A-402F and a bottom portion 404A-404F. The corrugated structures 400A-400F may be formed as part of the cover of the MEMS device package previously illustrated. In some embodiments, the corrugated structures 400A-400F may be formed as a separate structure and then attached to the inner region of the cover to form a corrugated surface of the cover. In another embodiment, the corrugated structures 400A-400F and the cover may be formed from a monolithic element. The top portions 402A-400F face inwardly to the volume formed within the cover of the MEMS device package. The corrugated structure 400A-400F may be formed from materials differ or identical to the materials to form the package such as plastic, metal, ceramic, silicon, or any suitable materials. Depending on the types of the material, different processes may be applied to the top portions 402A-402F of the structure 400A-400F to form a corrugated surface 406A-406F. The processes for forming the corrugated structures 400A-400F or the corrugated surfaces 406A-406F may include molding, forming, etching, grinding, polishing, anisotropic etching, or any suitable processes, depending on the materials. Examples of anisotropic etching may include deep-reactive-ion-etching (DRIE), reactive-ion-etching (RIE), or etc. Depending on the application, an optional metallization may be applied to the top portion 402 of the corrugated structure 400 by any suitable technique including sputtering, doping or etc. Once the surfaces 406A-406F are metalized, the metalized corrugation structures 400A-400F may be used as interconnects to connect the internal components disposed within the MEMS device package to any external components, circuit boards, or MEMS device packages. In some embodiment, the corrugated surface 406A-406F may be plated by any materials to create electrical interconnect. As illustrated in FIG. 4A, a plurality of U-shape groove 408A is formed on the top portion 402A by any suitable processing techniques. The depth, width, and length of the grooves 408A may be selected as desired, depending on the application. Now referring to FIG. 4B, the top portion 402B includes a plurality of trenches 408B having sharp points 410 formed on the surface 406B of the corrugated structure 400B. The depth, width, and length of the trenches 408B may be selected as desired, depending on the application. Unlike from the previous corrugated structures 400A, 400B, the corrugated structure 400C of FIG. 4C includes a plurality of trenches 408C having semicircle shape 410 at tips formed on the surface 406C. The depth, width, and length of the trenches 408C may be selected as desired, depending on the application. As depicted in FIG. 4D, a plurality of V-groove 408D is formed on the top portion 402D of the corrugated structure 400D. The depth, width, and length of the grooves 408D may be selected as desired, depending on the application. The geometry of the corrugated structure 400E illustrated in FIG. 4E is similar to the geometry of the corrugated structure 400A illustrated in FIG. 4A, except a bottom end 412E of the groove 408E is round instead of flat 412A. The depth, width, and length of the grooves 408E may be selected as desired, depending on the application. Now referring to FIG. 4F, the top portion 402F of the corrugated structure 400F includes a plurality of U-shape groove 408F having protrusions 414 formed on both sides of the groove 408F. The depth, width, and length of the grooves 408F may be selected as desired, depending on the application. The shape of the cross-sectional surface of each grooves or trenches 408A-408F may vary of the desired shape, depending on the application. The corrugated structure formed within the inner region of the MEMS device package enhances the strength of the walls of the lid, the spacer, or the cover. Forming the corrugated structure within the inner region of the MEMS device package further enhances the robustness of the MEMS device package.

Figure 5B:
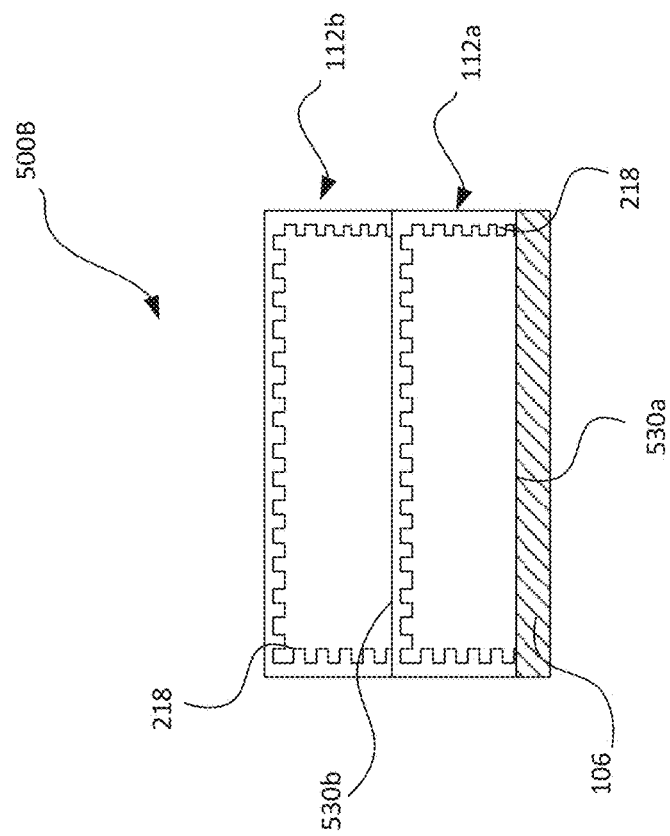
Figure 5A:
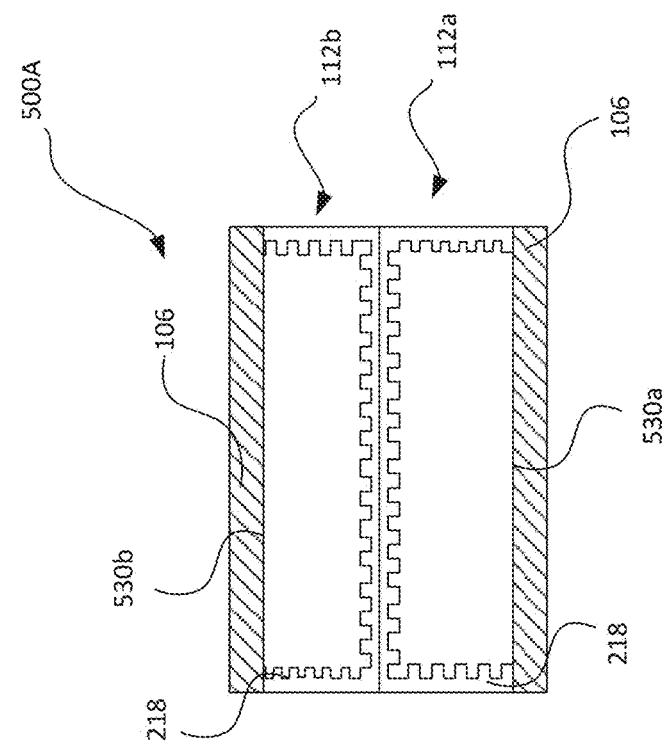

FIGS. 5A-5F illustrate various described embodiments of combo MEMS device package 500A-500F with one or more corrugated structures formed within the package. As previously described, the combo MEMS device package 500A-500F may be formed with one or more covers 112a, 112b for encapsulating any suitable internal components. As depicted in FIG. 5A, the combo MEMS device package 500A comprises covers 112a, 112b having openings 530a, 530b facing opposite and outwardly from each other. Each substrate 106 is coupled to the openings 530a, 530b of the covers 112a, 112b by any suitable attachment techniques for encapsulating any number of internal components. Corrugated structures 218 are formed on inner regions of the covers 112a, 112b. The corrugated structure formed on the cover 112a may either be the same geometry or different geometry to the corrugated structure formed on the cover 112b. The depth, width, length of the grooves or trenches of the corrugated structures 218 formed on both the covers 112a, 112b may varies, depending on the application. In another embodiment, as illustrated in FIG. 5B, the opening 530b of the cover 112b coupled to the top portion of the 112a by ay suitable attachment techniques. The cover 112b electrically coupled to the substrate 106 via the cover 112a. In some embodiments, any suitable internal components may be mounted to the corrugated structure 218 formed on the cover 112b. In another embodiment, outer top wall of the top portion of the 112a may provide an optional interconnects for coupling any suitable internal components. Additional components C may be disposed within the volume of the cover 112a once the cover 112a is coupled to the substrate 106. Both covers 112a, 112b are configured to encapsulate the components formed within the volumes. The corrugated structure formed on the cover 112a may either be the same geometry or different geometry to the corrugated structure formed on the cover 112b. The depth, width, length of the grooves or trenches of the corrugated structures 218 formed on both the covers 112a, 112b may varies, depending on the application. The combo MEMS device package 500C of FIG. 5C is similar to the combo MEMS device package 500A of FIG. 5A, except the openings 530a, 530b of the covers 112a, 112b of the package 500C face each other and inwardly. The openings 530a, 530b of the covers 112a, 112b are coupled to both sides of the common substrate 106 by any suitable attachment techniques for encapsulating any number of internal components. Thus, second substrate as illustrated in FIG. 5A is no longer required. Corrugated structures 218 are formed on both the covers 112a, 112b. The corrugated structure formed on the cover 112a may either be the same geometry or different geometry to the corrugated structure formed on the cover 112b. The depth, width, length of the grooves or trenches of the corrugated structures 218 formed on both the covers 112a, 112b may varies, depending on the application.

Now referring to FIG. 5D, various components C1-C3 are mounted on the common substrate 106. The combo MEMS device package 500D comprises a first package 540, a second package 542, and one or more components C1-C3 may be disposed within the first and second packages 540, 542. Each package 540, 542 comprises covers 112a, 112b having openings 530a, 530b and a common substrate 106 attached to the openings 530a, 530b. Unlike from the previous packages 500A-500C where the size of both covers 112a, 112b are substantially the same. The size of the cover 112a as illustrated in FIG. 5D, however, is larger than the size of the cover 112b. At least one component C1 mounted on the substrate 218 is disposed within the cover 112b having the corrugated structure 218 formed on the surface of the cover 112b. The corrugated structure formed on the cover 112a may either be the same geometry or different geometry to the corrugated structure formed on the cover 112b. The depth, width, length of the grooves or trenches of the corrugated structures 218 formed on both the covers 112a, 112b may varies, depending on the application. Any number of components C2, C3 mounted on the common substrate 218 adjacent to the cover 112b is disposed within the cover 112a. The cover 112a also encapsulates the cover 112b. Together, openings 530a, 530b of the covers 112a, 112b are coupled to the common structure 106 defines a combo MEMS device package 500D.

As depicted in FIG. 5E, the cover 112 of the MEMS device package 500E is identical to the cover 312 as illustrated in FIG. 3 in which the cover 112 also includes two volumes 320, 322 separated by a common region 324. A substrate 106 is attached to the cover 112 by any suitable attachment techniques. Any number of components may be mounted within the volumes 320, 322. Additional volumes may be formed within the volumes 320, 322 to encapsulate other MEMS devices which require to be hermetically sealed in the case an optional port is formed on the cover 112 of the MEMS device package 500E for receiving attributes from external environment outside the package 500E. A corrugated structure 218 is formed on the surface of the cover 112 found within the volumes 320, 322. The geometry of the corrugated structure 218 in the volume 320 may either be the same or different to the corrugated structure in the volume 322. The depth, width, length of the grooves or trenches of the corrugated structures 218 formed on both volume 320, 322 may also varies, depending on the application. Although the size of the covers 112a, 112b as illustrated in FIGS. 5A-5C are identical, it should be appreciated by those skilled in the art that the size of covers 112a, 112b may various, depending on the application. Further, the shape of the packages 500A-500F may varies too, depending on the application. In some embodiments, a corrugated structure 218' may be formed on an outer region 216 of the cover 112b by any known techniques. Not only the overall thickness of the cover 112b is substantially reduced, overall volume 322 formed within the cover 112a also increases. In another embodiment, the corrugated structure 218 on the inner wall of the cover 112b may not be required, depending on the application. Which is to say, the cover 112b requires the corrugated structure 218' on the outer wall but not on the inner wall of the cover 112b. The geometry, shape, and size of the corrugated structures 218', 218 may be the same or different. The depth, width, length of the grooves or trenches of the corrugated structures 218, 218' formed may varies, depending on the application.

Figure 6B:
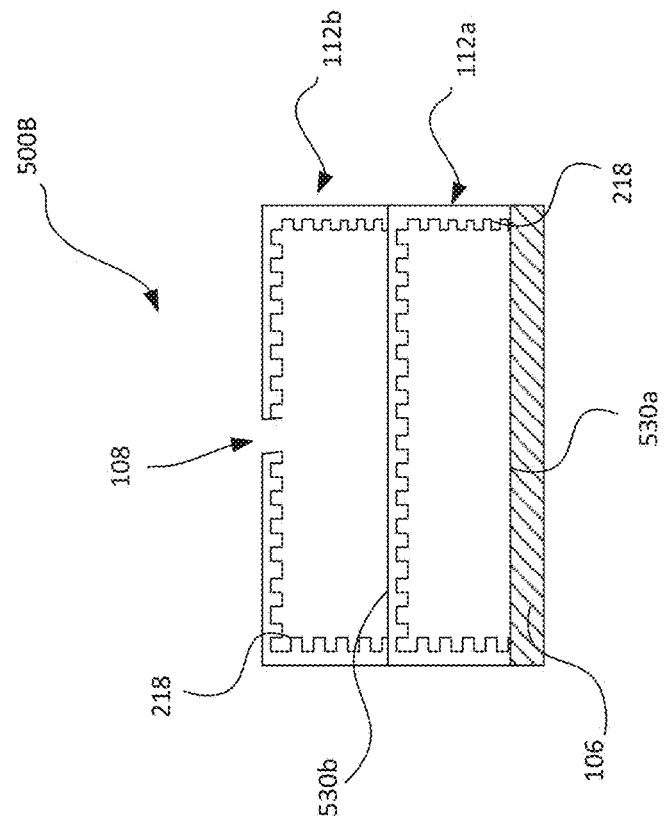
FIGS. 6A-6F are cross-sectional views illustrating various described embodiments of the combo MEMS device package of FIGS. 5A-5F with a port.
Figure 6A:
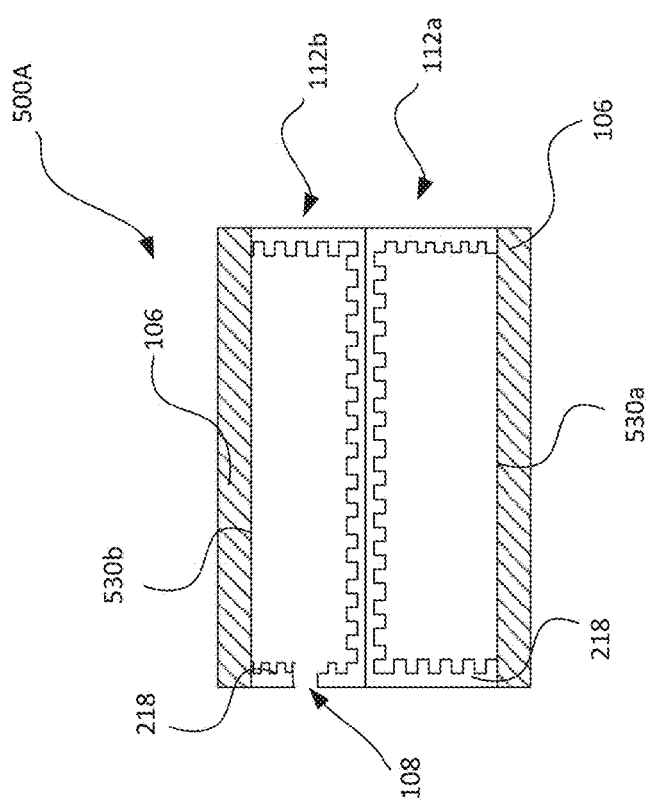
Figure 6D:
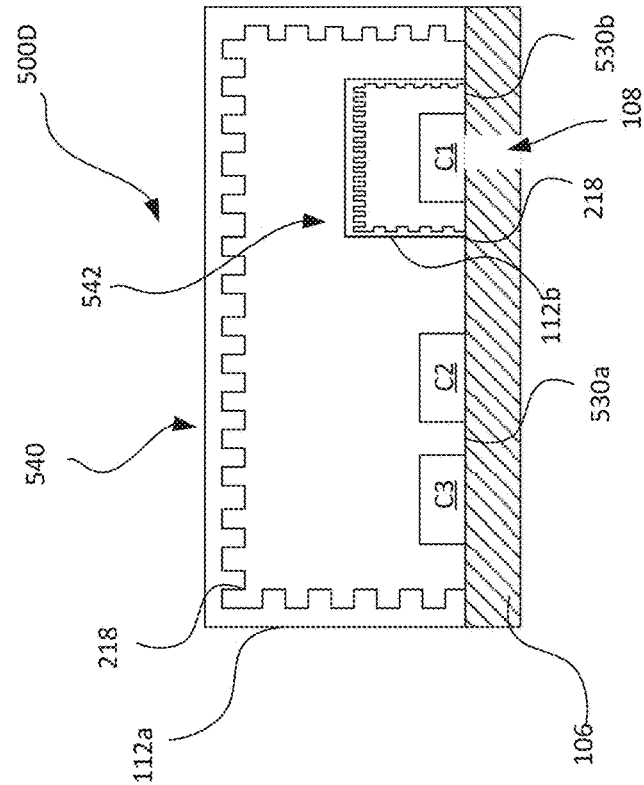
Figure 6C:
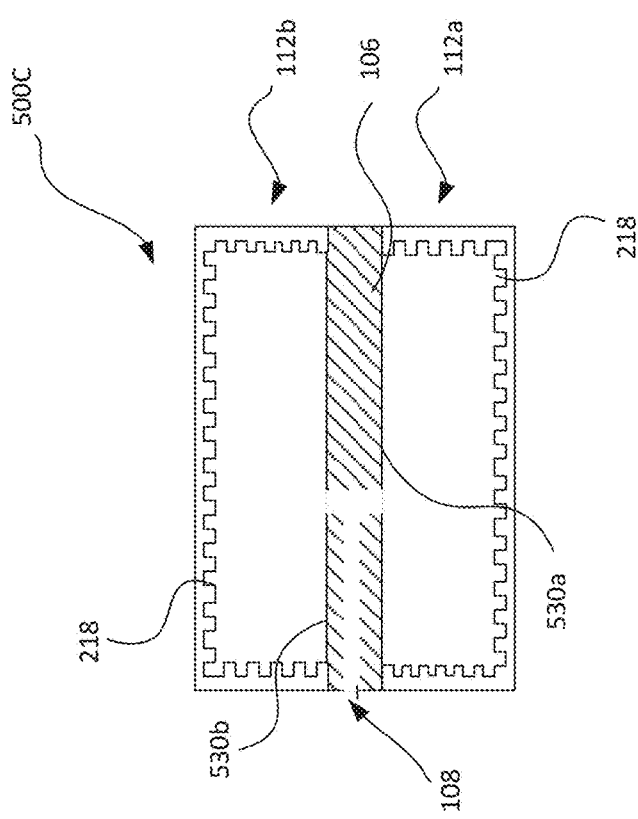
Figure 6F:
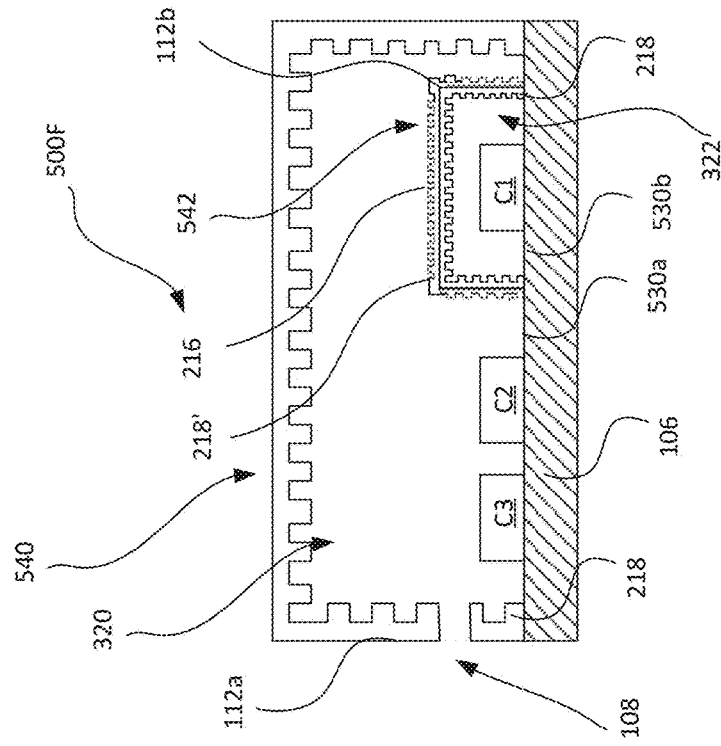
Figure 6E:
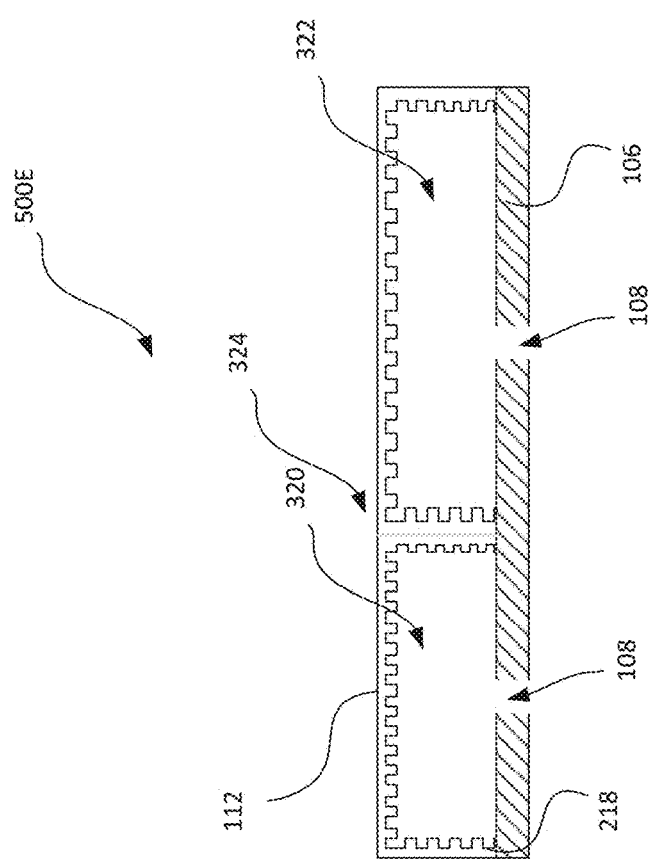

Combo MEMS device packages 500A-500F of with one or more corrugated structures formed within the package illustrated in FIGS. 5A-5F are identical to the Combo MEMS device packages 500A-500F of FIGS. 6A-6F, except one or more ports 108 are formed on in the packages of FIGS. 6A-6F. The port 108 may be formed on any sides or location of the covers 112a, 112b for receiving attributes from the external environment, as illustrated in FIGS. 6A, 6B by any known techniques. The port 108 may also be formed on the substrate 108, as depicted in FIGS. 6C, 6D. More than one port 108 may be formed on any covers 112a, 112b, substrate 108, or combination. As illustrated in FIG. 6E, two ports 108 are formed on the substrate 106 and each port 108 fluidly communicates the volume 320, 322 with external environment. The port 108 may be formed above, adjacent, in proximal to one or more of the internal components. In some embodiments, the port 108 may be formed above, adjacent, in proximal to one or more of the MEMS package device 112b.

The embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling with the sprit and scope of this disclosure.

While the patent has been described with reference to various embodiments, it will be understood that these embodiments are illustrative and that the scope of the disclosure is not limited to them. Many variations, modifications, additions, and improvements are possible. More generally, embodiments in accordance with the patent have been described in the context or particular embodiments. Functionality may be separated or combined in blocks differently in various embodiments of the disclosure or described with different terminology. These and other variations, modifications, additions, and improvements may fall within the scope of the disclosure as defined in the claims that follow.

What is claimed is:

1. A microelectromechanical system (MEMS) device package comprising:
   a substrate having a first surface and second surface;
   a cover having an inner region and an outer region, the cover is coupled to the substrate and defines a cavity between the inner region and the substrate;
   at least one device disposed within the cavity; and
   an acoustic port defined in one of the substrate and the cover and connecting the cavity to an external environment,
   wherein a corrugated structure is formed on at least one of the inner region and the outer region.

2. The MEMS device package of claim 1 wherein the inner region comprises an inner wall and the inner wall is the corrugated structure.

3. A microelectromechanical system (MEMS) device package comprising:
   a substrate having a first surface and second surface;
   a cover having an inner region and an outer region, the cover is coupled to the substrate and defines a cavity between the inner region and the substrate; and
   at least one device disposed within the cavity,
   wherein the outer region comprises an outer wall, and the outer wall includes a corrugated structure.

4. The MEMS device package of claim 1 wherein the cavity comprises a first volume and the corrugated structure is formed as a portion of the inner region and is located within the first volume.

5. The MEMS device package of claim 1 wherein the cover further comprises a common region, which divides the cavity into a first volume and a second volume.

6. The MEMS device package of claim 5 wherein the corrugated structure is defines at least one of the first and second volumes.

7. The MEMS device package of claim 3 further comprising an acoustic port defined in one of the substrate and the cover and connecting the cavity to an external environment.

8. The MEMS device package of claim 1 wherein the acoustic port is formed in the substrate.

9. The MEMS device package of claim 1 wherein the acoustic port is formed in the cover.

10. The MEMS device package of claim 1 wherein the device is selected from a group consisting of a MEMS transducer, a semiconductor device, a speaker, a receiver, a microphone, a pressure sensor, a thermal sensor, an optical sensor, an imaging sensor, a chemical sensor, a gyroscope, an accelerometer, a gas sensor, an environmental sensor, a motion sensor, a navigation sensor, an integrated circuit, an ASIC, a processor, a controller, and an energy storage device.

11. The MEMS device package of claim 3 wherein the package is hermetically sealed.

12. The MEMS device package of claim 1, wherein the cover includes a plurality of side walls and an outer wall, and the corrugated structure is formed on at least one of the plurality of side walls.

13. The MEMS device package of claim 12, wherein the corrugated structure is formed on each side wall of the plurality of side walls.

14. The MEMS device package of claim 12, wherein the corrugated structure is further formed on the outer wall.

15. The MEMS device package of claim 1, wherein the corrugated structure includes a top portion and a plurality of U-shaped grooves formed in the top portion.

16. The MEMS device package of claim 15, wherein the U-shaped grooves each include protrusions formed on both sides of the U-shaped grooves.

17. The MEMS device package of claim 1, wherein the corrugated structure includes a top portion and a plurality of trenches formed in the top portion, each pair of trenches being separated by a sharp point at the top portion.

18. The MEMS device package of claim 1, wherein the corrugated structure includes a top portion and a plurality of trenches formed in the top portion, each trench having a semicircle shape.

19. The MEMS device package of claim 1, wherein the corrugated structure includes a top portion and a plurality of V-shaped grooves.

20. The MEMS device package of claim 5 wherein the first and second volumes are isolated from one another.

21. The MEMS device package of claim 5 wherein the corrugated structure includes a first corrugated structure defining the first volume and a second corrugated structure defining the second volume.

22. The MEMS device package of claim 5, wherein the common region includes the corrugated structure.

* * * * *